(12) United States Patent
Jeong et al.

(10) Patent No.: US 11,665,979 B2
(45) Date of Patent: May 30, 2023

(54) MAGNETIC JUNCTIONS HAVING ENHANCED TUNNEL MAGNETORESISTANCE AND UTILIZING HEUSLER COMPOUNDS

(71) Applicants: Samsung Electronics Co., Ltd., Gyeonggi-do (KR); INTERNATIONAL BUSINESS MACHINES CORPORATION, Armonk, NY (US)

(72) Inventors: Jaewoo Jeong, San Jose, CA (US); Mahesh G. Samant, San Jose, CA (US); Yari Ferrante, San Jose, CA (US); Panagiotis Charilaos Filippou, San Jose, CA (US); Chirag Garg, Halle (DE); Stuart Stephen Papworth Parkin, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 299 days.

(21) Appl. No.: 16/840,179

(22) Filed: Apr. 3, 2020

(65) Prior Publication Data
US 2021/0175416 A1   Jun. 10, 2021

Related U.S. Application Data

(60) Provisional application No. 62/945,576, filed on Dec. 9, 2019.

(51) Int. Cl.
*H01L 43/10*   (2006.01)
*H01L 43/12*   (2006.01)
(Continued)

(52) U.S. Cl.
CPC ............ *H01L 43/10* (2013.01); *G11C 11/161* (2013.01); *H01F 10/329* (2013.01);
(Continued)

(58) Field of Classification Search
CPC ....... H01L 43/10; H01L 27/228; H01L 43/02; H01L 43/12; G11C 11/161;
(Continued)

(56) References Cited

U.S. PATENT DOCUMENTS 6,834,005 B1   12/2004 Parkin
7,005,691 B2    2/2006 Odagawa
(Continued)

FOREIGN PATENT DOCUMENTS

WO   WO-2017034563 A1 *  3/2017
WO   WO-2017222521 A1 * 12/2017
(Continued)

OTHER PUBLICATIONS

Graf et al., Simple Rules for the Understanding of Heusler Compounds, Progress in Solid State Chemistry, 39, 2011.

*Primary Examiner* — Jami Valentine Miller
(74) *Attorney, Agent, or Firm* — Lewis Roca Rothgerber Christie LLP (57) ABSTRACT

A method for providing a magnetic device and the magnetic device so provided are described. The magnetic device includes a magnetic layer having a surface. In some aspects, the magnetic layer is a free layer, a reference layer, or a top layer thereof. A tunneling barrier layer is deposited on the magnetic layer. At least a portion of the tunneling barrier layer adjacent to the magnetic layer is deposited at a deposition angle of at least thirty degrees from a normal to the surface of the magnetic layer. In some aspects, the deposition angle is at least fifty degrees.

11 Claims, 5 Drawing Sheets

(51) Int. Cl.
*H01L 43/02* (2006.01)
*H01L 27/22* (2006.01)
*G11C 11/16* (2006.01)
*H01F 10/32* (2006.01)
*H01F 41/32* (2006.01)

(52) U.S. Cl.
CPC ..... *H01F 10/3254* (2013.01); *H01F 10/3286* (2013.01); *H01F 41/32* (2013.01); *H01L 27/228* (2013.01); *H01L 43/02* (2013.01); *H01L 43/12* (2013.01)

(58) Field of Classification Search
CPC ............. H01F 10/3254; H01F 10/3286; H01F 10/329; H01F 41/32
USPC ........................................................ 257/427
See application file for complete search history.

(56) References Cited

U.S. PATENT DOCUMENTS

| | | | |
|---|---|---|---|
| 8,008,097 | B2 | 8/2011 | Parkin |
| 8,836,056 | B2 | 9/2014 | Oguz |
| 8,897,061 | B2 | 11/2014 | Ezaki |
| 10,103,321 | B2 * | 10/2018 | Kato ................ H01L 43/08 |
| 11,038,099 | B2 * | 6/2021 | Manipatruni ........ H01L 43/00 |
| 2016/0173100 | A1 * | 6/2016 | Nikonov ............. H01L 43/08 326/38 |
| 2016/0217842 | A1 * | 7/2016 | Jeong ............... H01F 10/1936 |
| 2018/0287052 | A1 * | 10/2018 | Wang ................. G11C 11/161 |
| 2019/0385655 | A1 * | 12/2019 | Lin .................... H01L 43/10 |
| 2019/0386208 | A1 * | 12/2019 | Lin .................... H01L 43/08 |

FOREIGN PATENT DOCUMENTS

| | | |
|---|---|---|
| WO | WO-2019005046 A1 * | 1/2019 |
| WO | WO-2019005147 A1 * | 1/2019 |
| WO | 20190125383 | 6/2019 |

* cited by examiner

MAGNETIC JUNCTIONS HAVING ENHANCED TUNNEL MAGNETORESISTANCE AND UTILIZING HEUSLER COMPOUNDS

CROSS REFERENCE TO OTHER APPLICATIONS

This application claims priority to U.S. Provisional patent Application No. 62/945,576 entitled ENHANCED TUNNELING MAGNETORESISTANCE WITH HEUSLER COMPOUNDS filed Dec. 9, 2019 which is incorporated herein by reference for all purposes.

BACKGROUND

Magnetic memories such as magnetic random access memories (MRAMs) store information utilizing magnetic materials as an information storage medium. For example, a magnetic tunneling junction (MTJ) may be used in an MRAM, such as a spin transfer torque MRAM (STT-MRAM). The MTJ typically includes a reference layer, a free layer and a tunneling barrier layer between the reference and free layers. The reference and free layers are magnetic. The magnetic moment of the reference layer is generally fixed, or pinned, in a particular direction. The free layer has a changeable magnetic moment and is used to store information. A bottom contact below the MTJ and a top contact on the MTJ are used to drive current through the MTJ in a current-perpendicular-to-plane (CPP) direction in an STT-MRAM. In case of MTJs with positive tunnel magnetoresistance (TMR), when a sufficient current is driven in one direction perpendicular-to-plane (e.g. top to bottom), the free layer magnetic moment switches to be parallel to that of the reference layer. When a sufficient current is driven in the opposite direction (e.g. bottom to top), the free layer magnetic moment switches to be antiparallel to that of the reference layer. Different magnetic configurations correspond to different magnetoresistances and thus different logical states (e.g. a logical "0" and a logical "1") of the MTJ.

Because of their potential for use in a variety of applications, research in magnetic memories is ongoing. Accordingly, what is needed is a method and system that may improve the performance of magnetic junctions.

BRIEF DESCRIPTION OF THE DRAWINGS

Various embodiments are disclosed in the following detailed description and the accompanying drawings.

DETAILED DESCRIPTION

The present disclosure describes embodiments that can be implemented in numerous ways, including as a process; an apparatus; a system; and/or a composition of matter. In general, the order of the steps of disclosed processes may be altered within the scope of the present disclosure.

A detailed description of one or more embodiments is provided below along with accompanying figures that illustrate the principles utilized. The present disclosure is described in connection with such embodiments, but is not limited to any particular embodiment described herein. The present disclosure encompasses numerous alternatives, modifications and equivalents. Numerous specific details are set forth in the following description in order to provide a thorough understanding of the present disclosure. These details are provided for the purpose of example and the present disclosure may be practiced according to the claims without some or all of these specific details. For the purpose of clarity, certain technical material that is known in the technical fields related to the present disclosure has not been described in detail so that the present disclosure is not unnecessarily obscured.

The embodiments are described in the context of particular methods, particular magnetic junctions and magnetic memories having certain components. The techniques described herein are consistent with the use of magnetic junctions and magnetic memories having other and/or additional components and/or other features not inconsistent with the present disclosure. The method and system are also described in the context of current understanding of the spin transfer phenomenon, of magnetic anisotropy, and other physical phenomenon. Consequently, theoretical explanations of the behavior of the method and system are made based upon this current understanding of spin transfer, magnetic anisotropy and other physical phenomena. However, the techniques described herein are not dependent upon a particular physical explanation. The embodiments are described in the context of a structure having a particular relationship to the substrate. However, the embodiments are consistent with other structures. In addition, the embodiments are described in the context of certain layers being synthetic and/or simple. However, one of ordinary skill in the art will readily recognize that the layers could have another structure. Furthermore, the techniques are described in the context of magnetic junctions and/or substructures having particular layers. However, magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the techniques may be used.

Magnetic tunneling junctions (MTJs) may be used in memories such as magnetic random access memories (MRAMs). MTJs may be programmable by a current driven in a current-perpendicular-to-plane (CPP) direction and used in a spin-transfer torque MRAM (STT-MRAM). Some MTJs utilize tunnel barriers formed from MgO as well as free and reference layers that include alloys of Co, Fe and B (termed "CoFeB" herein, without requiring a specific stoichiometry). The magnetic moments of the free and reference layers may be desired to be oriented perpendicular to the layer ("perpendicular-to-plane"). For magnetic layers having a perpendicular-to-plane magnetic moment, the perpendicular magnetic anisotropy (PMA) energy of the magnetic layer exceeds the out-of-plane demagnetization energy. Some CoFeB layers are sufficiently thin that the magnetic moment is oriented perpendicular-to-plane. However, the PMA of such a CoFeB layer arises from the interfaces between the CoFeB layer and the tunneling barrier layer and/or the underlayer on which the CoFeB layer is deposited. The demagnetization energy arises from the magnetic volume and increases in proportion with the magnetic volume of the CoFeB layer. Thus, CoFeB layers that are sufficiently thin can have magnetic moments with a perpendicular-to-plane orientation. However, this also means that such CoFeB layers may not be thermally stable if the device size is reduced to below approximately twenty nanometers in size. As such, Co—Fe—B layers may be unsuitable for use in more dense memory applications.

Magnetic materials that have a PMA arising from a volume effect and which may have a perpendicular-to-plane magnetic moment at small thicknesses include Heusler compounds. Heusler compounds may have the chemical formula $X_2YZ$ or $X'X''YZ$; where X, X', X", and Y may be transition metals or lanthanides (rare earth metals) and Z may be from a main group metal. Heusler compounds can have a structure of the type $Cu_2MnAl$ in which the elements are disposed on four interpenetrating face-centered cubic (fcc) lattices. Heusler compounds form a structure defined by the space group symmetry $L2_1$ (or $D0_{22}$ when they are tetragonally distorted). The properties of Heusler compounds are strongly dependent on the chemical ordering of the elements constituting the compounds. Many Heusler compounds are known to have a structure of the type $Cu_2MnAl$. Some of these Heusler compounds are ferromagnetic or ferrimagnetic due to magnetic moments on the X and/or Y sites. Some parent Heusler compounds are cubic and exhibit weak or no significant magnetic anisotropy. However, the structure of some magnetic Heusler compounds is tetragonally distorted. Such a tetragonal Heusler compound has a crystal structure that is tetragonal instead of cubic. A tetragonal Heusler compound may also be magnetic. Due to the tetragonal distortion the magnetization exhibited by these compounds may be preferably aligned along the tetragonal axis. Thin films formed from such materials may exhibit PMA due to a magneto-crystalline anisotropy associated with their tetragonally distorted structure. For example, such tetragonal Heusler compounds include $Mn_3Z$ where Z=Ga, Ge, Sn, and Sb. Some such tetragonal Heusler compounds may be grown at smaller thicknesses and maintain their PMA. For example, with underlayers such as $Mn_xN$ (where x is within range of 2 to 4.5) and CoAl (nominally 1:1 composition ratio), some tetragonal Mn-containing Heusler compounds possessing PMA may be grown with smaller thicknesses. Similarly, magnetic $L1_0$ compounds containing Mn may be grown at smaller thicknesses. Such magnetic $L1_0$ compounds include MnSb alloys, MnAl alloys, MnSn alloys and MnGa alloys. Similarly tetragonal C38 phase of Mn containing compounds such as MnAlGe, MnGaGe, MnAlGa, MnGeIn, and MnGaSn, etc. which are ferromagnetic and low moment can also be used as free layer within MTJ device. However, the tunneling magnetoresistance (TMR) of the MTJ devices with such ultra-thin Mn-containing Heusler compounds may be significantly reduced. For example, in some instances, the TMR is on the order of ten percent or less, which is undesirable. Consequently, a mechanism for enhancing the TMR of magnetic junctions while maintaining their PMA is desirable.

A method for providing a magnetic device and the magnetic device so provided are described. The magnetic device includes a magnetic layer having a surface on which a tunneling barrier layer is formed. The magnetic layer may include at least one of: a Heusler, an $L1_0$ and/or a C38 compound, which may contain Mn. In some embodiments, the Heusler compound is a tetragonal Heusler compound. A tunneling barrier layer is deposited on the magnetic layer utilizing a high deposition angle. The deposition angle is at least thirty degrees from normal to the surface of the magnetic layer. In some embodiments, deposition angle is at least fifty degrees and not more than ninety degrees from normal to the surface of the magnetic layer. The region closest to the magnetic layer is deposited at the high deposition angle. For example, a thickness of at least one unit cell or more is deposited at the high deposition angle. The deposition angle used can vary. For example, part of the tunneling barrier layer may be deposited at a second deposition angle that is not more than thirty degrees. In some embodiments, the second deposition angle may be greater than thirty degrees but different from the deposition angle. In some embodiments, the tunneling barrier layer formed is MgO. In some embodiments, the tunneling barrier layer is $Mg_{1-z}Al_{2-z}O_4$, where $-0.5<z<0.5$.

An additional magnetic layer may be provided on the tunneling barrier layer. The magnetic layer and the additional magnetic layer may correspond to free and reference layers. Thus, the free layer, the reference layers and the tunneling barrier layer between the free and reference layers are fabricated. In some embodiments, a dual magnetic junction is formed. In such embodiments, an additional tunneling barrier layer and an additional magnetic layer may be formed. In some embodiments, the additional tunneling barrier layer may be deposited as described above for the tunneling barrier layer.

Using the method described herein, a magnetic junction may utilize Mn-containing Heusler compounds, Mn-containing $L1_0$ compounds and/or Mn-containing C38 compounds having a PMA energy that exceeds their out-of-plane demagnetization energy. The magnetic junction may also exhibit improved TMR. For example, in some embodiments, TMR may be forty percent or higher at room temperature. In some embodiments, the TMR may be fifty percent or higher at room temperature. In some embodiments, TMR may be as large as eight hundred fifty percent at room temperature. In some embodiments, TMR does not exceed three hundred percent at room temperature. In some embodiments, TMR is not more than two hundred and fifty percent at room temperature. In some embodiments, TMR is not more than two hundred percent at room temperature. Consequently, both a perpendicular-to-plane orientation and a sufficiently high TMR may be obtained for magnetic junctions using thin magnetic layers. Further, because the PMA arises from a volume effect, the PMA may be present and the magnetic junction thermally stable for smaller magnetic junctions (e.g. not more than approximately twenty nanometers in length) that are usable in higher density MRAM.

Figure 1:
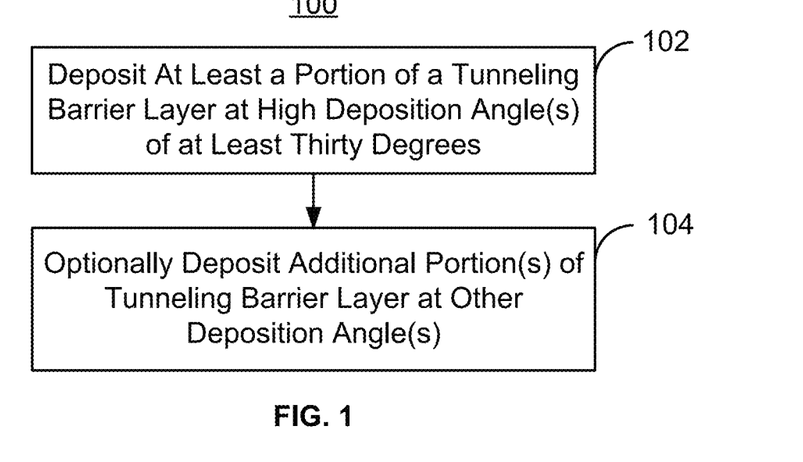
FIG. 1 is a flow chart depicting an embodiment of a method for providing a tunneling barrier layer in a magnetic device utilizing a high deposition angle.

FIG. 1 is a flow chart depicting an embodiment of method 100 for providing a tunneling barrier layer in a magnetic device. The magnetic device may include a magnetic junction and/or devices incorporating the magnetic junction, such as a magnetic memory programmable using spin transfer torque. For simplicity, some processes are shown in a particular order. However, some processes may be omitted, performed in another order, include substeps and/or combined. Further, the method 100 may start after other processes in forming the magnetic device have been performed. If forming a magnetic junction, in general the layers for the magnetic junction are deposited in a stack, the stack may undergo processing such as some annealing, mask layer(s) provided, the mask photolithographically defined on the stack, and the edges of the magnetic junction defined by etching portions of the layers of the stack exposed by the mask(s). Thus, processes in method 100 may be interleaved. In some embodiments, the various layers described herein may be deposited through any one or more of a number of methods, including magnetron sputtering, electrodeposition, ion beam sputtering, atomic layer deposition, chemical vapor deposition, and thermal evaporation.

Method 100 starts after the underlying magnetic layer has been provided. Other and/or additional layers may also have been provided. In some embodiments, an interfacial layer may be provided on the magnetic layer. The magnetic layer may include one or more of: a Heusler, an $L1_0$ and/or a C38 compound. In some embodiments, the magnetic layer consists of the Heusler, $L1_0$ and/or C38 compound(s). The Heusler, $L1_0$ and/or C38 compound(s) may contain Mn. In some embodiments, the Heusler compound is a tetragonal Heusler compound. The PMA energy of the magnetic layer may also exceed the out-of-plane demagnetization energy. Thus, the magnetic moment of the magnetic layer may be perpendicular-to-plane. The magnetic layer provided before method 100 commences may be thin, for example not more than twenty Angstroms thick. In some embodiments, the magnetic layer is not more than fifteen Angstroms thick. For example, the magnetic layer may be nominally twelve Angstroms thick.

At least a portion of a tunneling barrier layer is deposited on the magnetic layer utilizing at least one deposition angle of at least thirty degrees from normal to the surface of the magnetic layer, at 102. In some embodiments, the deposition angle(s) are at least forty degrees. In some embodiments, the deposition angle(s) are at least fifty degrees from the normal to the surface. The portion of the tunneling barrier layer closest to the magnetic layer is deposited at the deposition angle(s). For example, a thickness of one unit cell or more is deposited at deposition angle(s) of at least thirty degrees. In some embodiments, one or more unit cells are deposited at deposition angle(s) of at least fifty degrees. A single, constant deposition angle may be used at 102. In other embodiments, the deposition angle for 102 may vary but remains in the range described above. In some embodiments, 102 includes depositing MgO. In some embodiments, 102 includes depositing $Mg_{1-z}Al_{2-z}O_4$, where $-0.5<z<0.5$. In some embodiments, other and/or additional material(s) may be deposited at 102. For example, 102 may include depositing another (001)-oriented material, such as CaO and LiF.

The deposition angle used for the remainder of the tunneling barrier layer may vary. Thus, additional portion(s) of the tunneling barrier layer may optionally be deposited at other deposition angle(s), at 104. In some embodiments, the additional deposition angle(s) may still be at least thirty degrees from normal to the surface. The additional deposition angle(s) may be at least fifty degrees from normal to the surface. These additional deposition angle(s) may include angles that are the same or different from the deposition angle(s) used at 102. In some embodiments, the additional deposition angle(s) may be less than thirty degrees. Thus, the angle(s) used at 104 may vary. MgO and/or $Mg_{1-z}Al_{2-z}O_4$, where $-0.5<z<0.5$ may be deposited at 104. In some embodiments, the tunneling barrier layer formed using method 100 includes or consists of MgO. In some embodiments, the tunneling barrier layer formed using method 100 includes or consists of $Mg_{1-z}Al_{2-z}O_4$, where $-0.5<z<0.5$. In some embodiments, other and/or additional material(s) may be deposited at 102.

Figure 2:
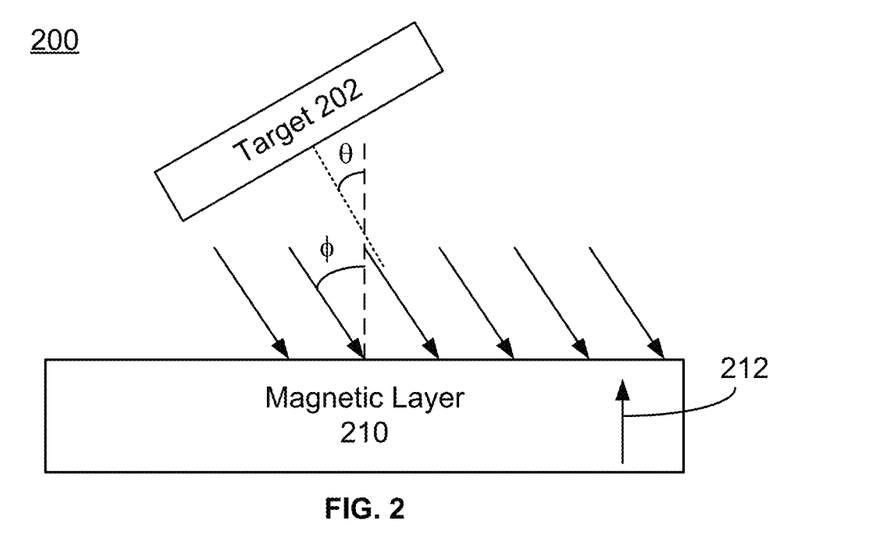
FIGS. 2-3 are diagrams depicting embodiments of devices including tunneling barrier layer(s) formed using high deposition angle(s).
Figure 3:
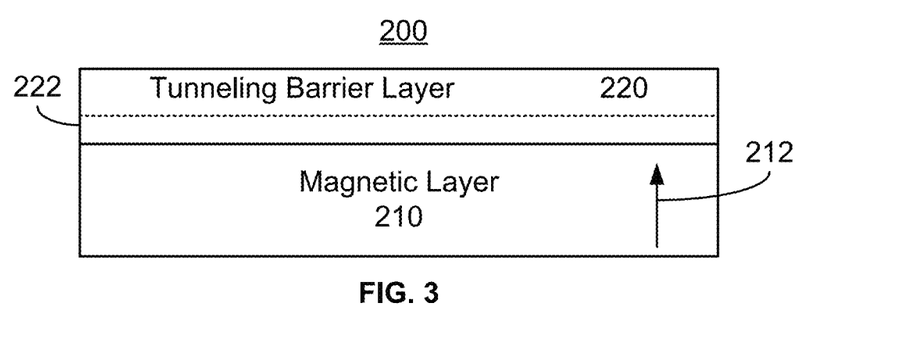

For example, FIGS. 2-3 depict an embodiment of a portion of magnetic device 200 during formation of a tunneling barrier layer using method 100. Magnetic junction 200 may include other and/or additional structures that are not shown. FIGS. 2-3 are not to scale. FIG. 2 depicts a magnetic device during 102 of method 100. Thus, magnetic layer 210 is shown. Target 202 used in forming the tunneling barrier layer is also shown. Magnetic layer 210 may be a Mn-containing Heusler, Mn-containing $L1_0$ and/or Mn-containing C38 compound(s). In some embodiments, magnetic layer 210 consists of the Heusler, $L1_0$ and/or C38 compound(s). The Heusler compound of magnetic layer 210 is a tetragonal Heusler compound. The Heusler compound may be one or more of $Mn_3Z$ where Z=Ga, Ge, Sn, and Sb. This stoichiometry may vary in some cases. In some embodiments, the Heusler compound includes one or more of $Mn_{3.1-x}Ge$, $Mn_{3.1-x}Sn$, and $Mn_{3.1-y}Sb$, where x is at least 0 and not more than 0.6 for $Mn_{3.1-x}Ge$ and $Mn_{3.1-x}Sn$ and where y is at least 0 and not more than 1.1 in the case of $Mn_{3.1-y}Sb$. In some embodiments, the Heusler compound is a ternary Heusler compound. For example, the ternary Heusler compound may be $Mn_{3.1-x}Co_{1.1-y}Sn$, where x is not more than 1.2 and y is not more than 1.0. In some embodiments, the ternary Heusler compound is $Mn_{3.1-x}Co_{1.1-y}Ge$, where x is not more than 1.2 and y is not more than 1.0. In some embodiments, $L1_0$ compounds containing Mn include MnSb alloys, MnAl alloys, MnSn alloys and MnGa alloys. In some embodiments, C38 compounds containing Mn include MnAlGe, MnAlGa, MnGaGe, and MnGeIn. Magnetic layer 212 has a PMA energy greater than its out-of-plane demagnetization energy less. Thus, magnetic moment 212 is perpendicular-to-plane. Magnetic layer 210 may also be thin. For example, magnetic layer 210 may be not more than twenty Angstroms thick. In some embodiments, magnetic layer 210 is not more than fifteen Angstroms thick. Also shown are deposition angle(s), θ, for the tunneling barrier layer being formed. The deposition angle is the angle between the normal to the surface of the layer on which the tunneling barrier is formed and the normal to the surface of the target used in forming the tunneling barrier layer. In FIG. 2, therefore, the deposition angle is the angle between the normal to the surface of magnetic layer 210 (the dashed line) and the normal to the surface of target 202 (the dotted line). This deposition angle could also be considered the angle between normal to the surface of the wafer (not explicitly shown in FIG. 2) on which magnetic layer 210 is formed and the normal to the surface of target 202. Thus, $\theta$ is at least thirty degrees. In some embodiments, $\theta$ is at least forty degrees. In some such embodiments, $\theta$ is at least fifty degrees. In addition, $\theta$ may be not more than ninety degrees. Also shown is, $\phi$, the angle between the normal to the surface of the layer on which the tunneling barrier layer is formed and the direction at which atoms or molecules from the target used in forming the tunneling barrier layer strike the surface. In the embodiment shown in FIG. 2, $\phi$ is the angle between the normal to the surface of magnetic layer 210 (the dashed line) and the arrows indicating the direction of travel of atoms or molecules from the target. In some cases, $\theta$ and $\phi$ may be the same. However, in other cases, $\theta$ and $\phi$ may differ.

FIG. 3 depicts magnetic device 200 after 102 and, optionally, 104 have been performed. Thus, tunneling barrier layer 220 has been formed. In some embodiments, tunneling barrier layer 220 is between magnetic layers in the completed device. However, in other embodiments, tunneling barrier layer 220 need not reside between magnetic layers. The tunneling barrier layer may be an insulator, but may allow current to pass through it, for example, via tunneling. Tunneling barrier layer 220 includes portion 222 that is at least one unit cell thick. In some embodiments, portion 222 is at least four Angstroms thick. In some embodiments, portion 222 is at least five Angstroms thick. Portion 222 is deposited at 102. Thus, portion 222 is deposited at deposition angle(s), $\theta$, of at least thirty degrees. In some embodiments, portion 222 is deposited at deposition angle(s), $\theta$, of at least fifty degrees. In some embodiments, the remaining portion of tunneling barrier layer 220 is deposited at different deposition angle(s) at 104. In some embodiments, 104 is omitted and the remaining portion of tunneling barrier layer 220 is deposited at the same deposition angle(s) as 102. Stated differently, the entire tunneling barrier layer 220 may be formed at 102. In some embodiments, tunneling barrier layer 220 includes or consists of MgO and/or $Mg_{1-z}Al_{2-z}O_4$, where $-0.5<z<0.5$.

Using method 100 a tunneling barrier layer such as tunneling barrier layer 220 may be formed. Because at least portion 222 of tunneling barrier layer 220 is formed using method 100, underlying magnetic layer 210 may be less likely to be oxidized. For example, Mn in an Mn-containing Heusler, $L1_0$ and/or C38 compound may be less likely to be oxidized. Consequently, performance of a magnetic junction incorporating tunneling barrier layer 220 may be improved. For example, the TMR may be enhanced.

Figure 4:
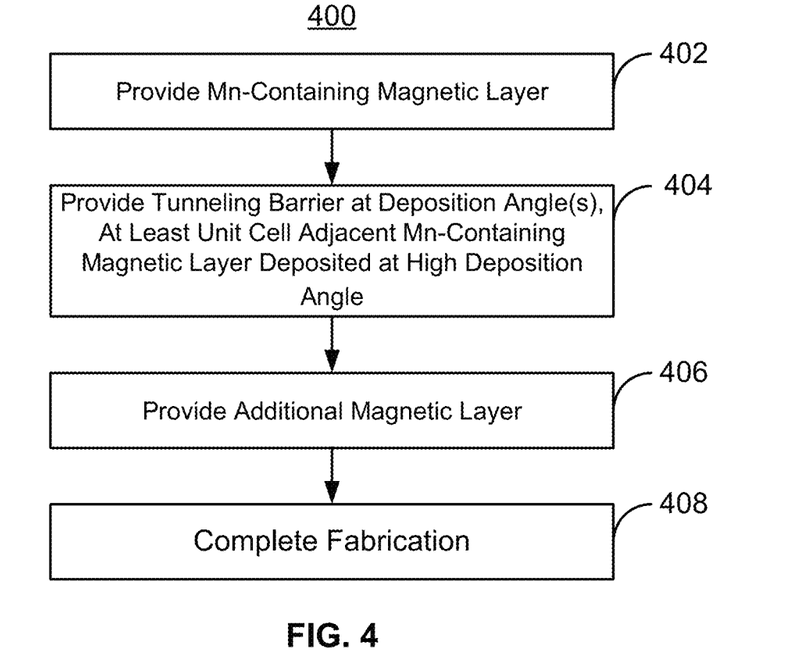
FIG. 4 is a flow chart of a method for providing a magnetic junction including tunneling barrier layer(s) formed using high deposition angle(s).

FIG. 4 is a flow chart depicting an embodiment of method 400 for providing a magnetic device including a tunneling layer fabricated utilizing a high deposition angle. The magnetic device may include a magnetic junction and/or devices incorporating the magnetic junction, such as a magnetic memory programmable using spin transfer torque. For simplicity, some processes are shown in a particular order. However, some processes may be omitted, performed in another order, include substeps and/or combined. Further, the method 400 may start after other processes in forming the magnetic device have been performed. If forming a magnetic junction, in general the layers for the magnetic junction are deposited in a stack, the stack may undergo processing such as some annealing, mask layer(s) are provided, mask(s) photolithographically defined on the stack, and the edges of the magnetic junction defined by etching portions of the layers of the stack exposed by the mask(s). Thus, processes in method 400 may be interleaved. In some embodiments, the various layers described herein may be deposited through any one or more of a number of methods, including magnetron sputtering, electrodeposition, ion beam sputtering, atomic layer deposition, chemical vapor deposition, and thermal evaporation.

A magnetic layer is provided, at 402. In some embodiments, the magnetic layer provided at 402 includes one or more Heusler compounds, $L1_0$ compounds and/or C38 compounds containing Mn. In some embodiments, the magnetic layer consists of the Mn-containing Heusler, Mn-containing $L1_0$ and/or Mn-containing C38 compound(s). In some embodiments, the Heusler compound(s) include tetragonal Heusler compound(s). In some embodiments, the Heusler compound(s) are selected from the Heusler compounds discussed above. Similarly, in some embodiments, the $L1_0$ compound(s) are selected from the $L1_0$ compounds described above. Similarly, in some embodiments, the C38 compound(s) are selected from the C38 compounds described above. The PMA energy of the magnetic layer may also exceed the out-of-plane demagnetization energy. Thus, the magnetic moment of the magnetic layer may be perpendicular-to-plane. The magnetic layer provided at 402 may also be thin, for example not more than fifteen Angstroms thick. In some embodiments, an interfacial layer may be provided on the magnetic layer as part of 402.

At least a portion of a tunneling barrier layer is deposited on the magnetic layer utilizing at least one deposition angle of at least thirty degrees from normal to the surface of the magnetic layer, at 404. In some embodiments, the deposition angle(s) are at least forty degrees. In some embodiments, the deposition angle(s) are at least fifty degrees. The deposition angle(s) may also not exceed ninety degrees. In some embodiments, only a portion of the tunneling barrier is formed using such high deposition angles. Remaining portion(s) of the tunneling barrier layer may be fabricated using other, including smaller, deposition angles. Thus, method 100 may be used to perform 404. In some embodiments, 404 includes depositing one or more of MgO and $Mg_{1-z}Al_{2-z}O_4$, where $-0.5<z<0.5$ An additional magnetic layer is provided, at 406. In some embodiments, the additional magnetic layer is analogous to the magnetic layer provided at 402. For example, the magnetic layer provided at 406 includes one or more Heusler, $L1_0$ and/or C38 compounds containing Mn. In some embodiments, the magnetic layer consists of the Mn-containing Heusler, Mn-containing $L1_0$ compound(s) and/or C38 compounds. In some embodiments, the Heusler compound(s) include tetragonal Heusler compound(s). In some embodiments, the Heusler compound(s), $L1_0$ compound(s) and/or C38 compound(s) are selected from the Heusler, $L1_0$ and/or C38 compounds discussed above. The PMA energy of the magnetic layer may also exceed the out-of-plane demagnetization energy. Thus, the magnetic moment of the magnetic layer may be perpendicular-to-plane. In some embodiments, the magnetic layer provided at 402 is a reference layer and the magnetic layer provided at 406 is a free layer. In some embodiments, the magnetic layer provided at 402 is a free layer and the magnetic layer provide at 406 is a reference layer. In some embodiments, the additional magnetic layer provided at 406 may include Fe, a CoFe alloy and/or a CoFeB alloy.

Fabrication of the magnetic device is completed, at 408. In some embodiments, an additional tunneling barrier layer and an additional magnetic layer are provided at 408. In some embodiments, the additional tunneling barrier layer is formed using method 100. In some embodiments, the magnetic layer provided at 408 is analogous to the layer(s) provided at 402 and/or 406. Thus, a dual magnetic junction may be provided. Capping layer(s), contacts and other structures may also be provided at 408.

Figure 5:
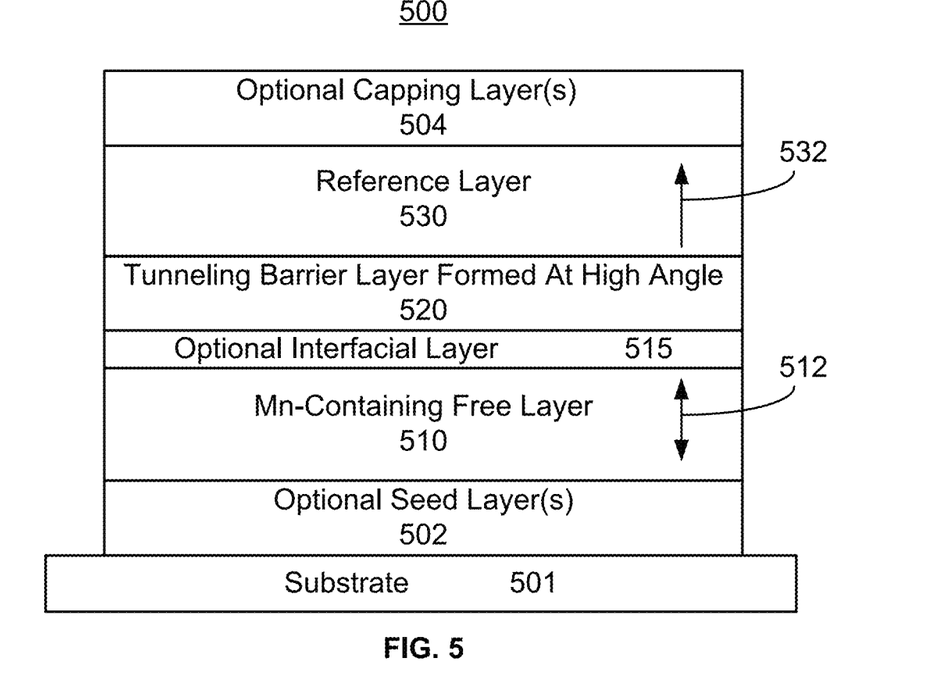
FIG. 5 depicts an embodiment of a magnetic junction including a tunneling barrier layer formed using high deposition angle(s).

For example, FIG. 5 depicts an embodiment of a portion of magnetic device 500 formed using method 400. Magnetic device 500 is a magnetic junction formed on substrate 501. Magnetic junction 500 may include other and/or additional structures. For clarity, FIG. 5 is not to scale. Magnetic device 500 includes Mn-containing free layer 510 having changeable magnetic moment 512, tunneling barrier layer 520 and reference layer 530 having magnetic moment 532. Free layer 510 is formed at 402. Tunneling barrier layer 520 is fabricated at 404. Reference layer 530 is provided at 406. In some embodiment, magnetic junction 500 includes optional seed layer(s) 502, optional interfacial layer 515 and/or optional capping layer(s) 504. An optional interfacial layer 515 may be a polarization enhancement layer. In such an embodiment, the TMR of magnetic junction 500 may be improved. Such a polarization enhancement layer may include Fe, a CoFe alloy, or $Co_2MnSi$ or another Heusler, $L1_0$ and/or C38 compound. Although shown as residing only between free layer 510 and tunneling barrier layer 520, such a polarization enhancement layer could be placed only below, only above or both above and below tunneling barrier layer 520.

Free layer 510 may include a Mn-containing Heusler, Mn-containing $L1_0$ and/or Mn-containing C38 compound(s). In some embodiments, free layer 510 consists of the Heusler, $L1_0$ and/or C38 compound(s). The Heusler compound may be a tetragonal Heusler compound. For example, the Heusler compound may be one or more of $Mn_3Z$ where Z=Ga, Ge, Sn, and Sb. This stoichiometry may vary in some cases. In some embodiments, the Heusler compound includes one or more of $Mn_{3.1-x}Ge$, $Mn_{3.1-x}Sn$, and $Mn_{3.1-y}Sb$, where x is at least 0 and not more than 0.6 for $Mn_{3.1-x}Ge$ and $Mn_{3.1-x}Sn$ and where y is at least 0 and not more than 1.1 in the case of $Mn_{3.1-y}Sb$. In some embodiments, the Heusler compound is a ternary Heusler compound. For example, the ternary Heusler compound may be $Mn_{3.1-x}Co_{1.1-y}Sn$, where x is not more than 1.2 and y is not more than 1.0. In some embodiments, the ternary Heusler compound is $Mn_{3.1-x}Co_{1.1-y}Ge$, where x is not more than 1.2 and y is not more than 1.0. In some embodiments, $L1_0$ compounds containing Mn include MnSb alloys, MnAl alloys, MnSn alloys and MnGa alloys. In some embodiments, C38 compounds containing Mn include MnAlGe, MnAlGa, MnGaGe, and MnGeIn. Free layer 510 has a PMA energy greater than its out-of-plane demagnetization energy less. Thus, magnetic moment 512 is perpendicular-to-plane. Further, free layer 510 may be thin. In some embodiments, free layer 510 is not more than twenty Angstroms thick. In some embodiments, free layer 510 is not more than fifteen Angstroms thick. For example, free layer 510 may be nominally twelve Angstroms thick.

Tunneling barrier layer 520 has been formed using a high deposition angle (e.g. at least thirty degrees, at least forty degrees in some cases, at least fifty degrees and not more than ninety degrees in some embodiments). The portion of tunneling barrier layer 520 deposited at a high deposition angle is at least one unit cell thick. In some embodiments, such a portion is at least four Angstroms thick. In some embodiments, such a portion is at least five Angstroms thick. In some embodiments, all of tunneling barrier layer 520 is deposited at high deposition angle(s). In some embodiments, tunneling barrier layer 520 includes or consists of MgO (e.g. with a (001) texture). In some embodiments, tunneling barrier layer 520 may include or consist of another (001)-oriented material, such as CaO and LiF. In some embodiments, $MgAl_2O_4$ can also be used in or for tunneling barrier layer 520. In such embodiments, the lattice spacing may be tuned by controlling Mg—Al composition to provide a better lattice matching with the Heusler, $L1_0$ and/or C38 compounds. In such embodiments, tunneling barrier layer 520 may include or consist of $Mg_{1-z}Al_{2-z}O_4$, where $-0.5<z<0.5$. Other materials may be used for tunneling barrier layer 520 in other embodiments.

Reference layer 530 has magnetic moment 532 and may include a Heusler, $L1_0$ and/or C38 compound(s), such as those used in free layer 510. Thus, in some embodiments, reference layer 530 may be formed in an analogous manner to free layer 510. In some embodiments, reference layer 530 may include Fe, a CoFe alloy, or a CoFeB alloy. In some embodiments, reference layer 530 has a thickness analogous to that of free layer 510. However, other thicknesses are possible. Magnetic moment 532 is perpendicular-to-plane. In some embodiments, magnetic moment 532 of reference layer 530 is stabilized (e.g. the coercivity of reference layer 530 is made significantly higher than the coercivity of the free layer 510) by contacting it to a synthetic anti-ferromagnetic (SAF) structure or other magnetic stabilization structure.

Method 400 can be used to fabricate magnetic junction 500 having tunneling barrier layer 520 at least a portion of which is deposited at a high deposition angle. Because at least a portion of tunneling barrier layer 520 adjacent to free layer 510 (e.g. at least a unit cell thick and closest to free layer 510 or interfacial layer 515) is formed using method 100, underlying free layer 510 may be less likely to be oxidized. TMR may be improved. For example, TMR for magnetic junction 500 may be at least forty percent. In some embodiments, TMR for magnetic junction 500 is at least fifty percent. In some cases, TMR for magnetic junction 500 may be higher. In some embodiments, TMR may be not more than eight hundred fifty percent at room temperature (e.g. twenty through twenty-five degrees Celsius). In some embodiments, TMR is not more than three hundred percent at room temperature. In some embodiments, TMR does not exceed two hundred and fifty percent at room temperature. In some embodiments, TMR is not more than two hundred percent at room temperature. Higher TMR (e.g. fifty percent through two hundred percent or above at room temperature) may be achieved in some embodiments by improving the coherency between the tunneling barrier and magnetic layers and/or by reducing thermal fluctuations that disturb the spin polarization of the magnetic layer. For example, the fabrication and materials used for the magnetic and tunneling barrier layers may be selected to reduce the lattice mismatch, with a goal of obtaining an epitaxial interface between the tunneling barrier and magnetic layers. In some embodiments, the materials utilized may be engineered to increase the Curie temperature via doping. Other and/or additional mechanisms may be utilized to improve TMR in some embodiments. As a result, magnetic junction 500 may have improved performance while maintaining perpendicular magnetic moments and thermal stability at small sizes. For example, magnetic junctions 500 having a length of not more than approximately twenty nanometers may still have thermally stable perpendicular-to-plane magnetic moments and having improved TMR.

Figure 6A:
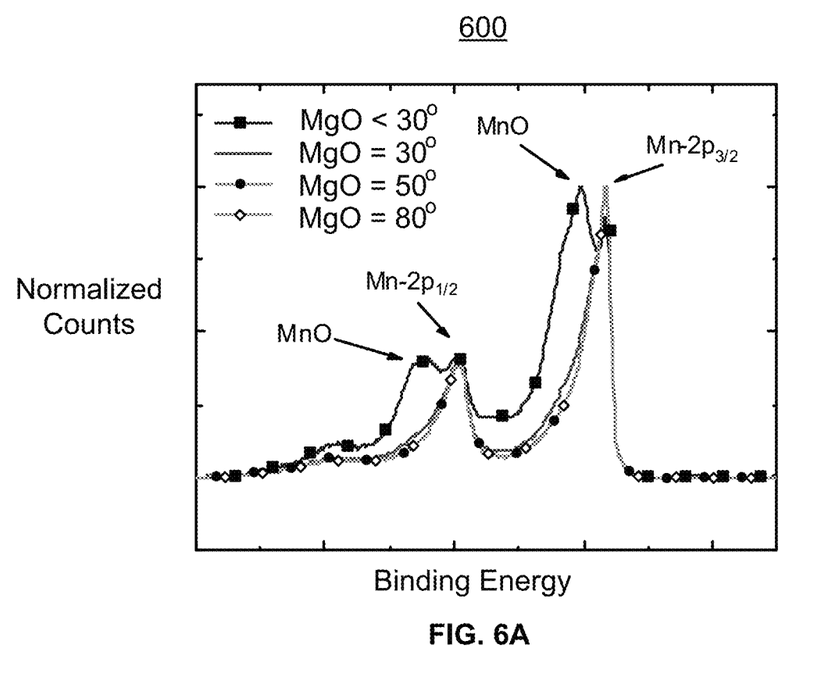
FIGS. 6A-6B are graphs depicting photoelectron spectroscopy for magnetic junctions having tunneling barrier layers formed at different deposition angles.

For example, FIGS. 6A and 6B are graphs indicating x-ray photoelectron spectroscopy (XPS) data that might be obtained utilizing magnetic junctions formed using method 400 and other magnetic junctions. Graph 600 depicted in FIG. 6A depicts XPS data for embodiments magnetic junction 500 in which tunneling barrier layer 520 is formed using deposition angles of thirty degrees, fifty degrees, and eighty degrees. Also shown in graph 600 is data for a magnetic junction (not shown) in which the tunneling barrier layer is formed using a lower deposition angle less than thirty degrees (e.g. twenty degrees). As can be seen in graph 600, the oxidation of Mn is greatly increased for magnetic junctions in which the tunneling barrier layer is formed using a lower deposition angle. This is indicated by the presence of MnO peaks for this magnetic junction. The oxidation of Mn is reduced for all magnetic junctions having MgO formed using deposition angles of thirty degrees or more.

Figure 6B:
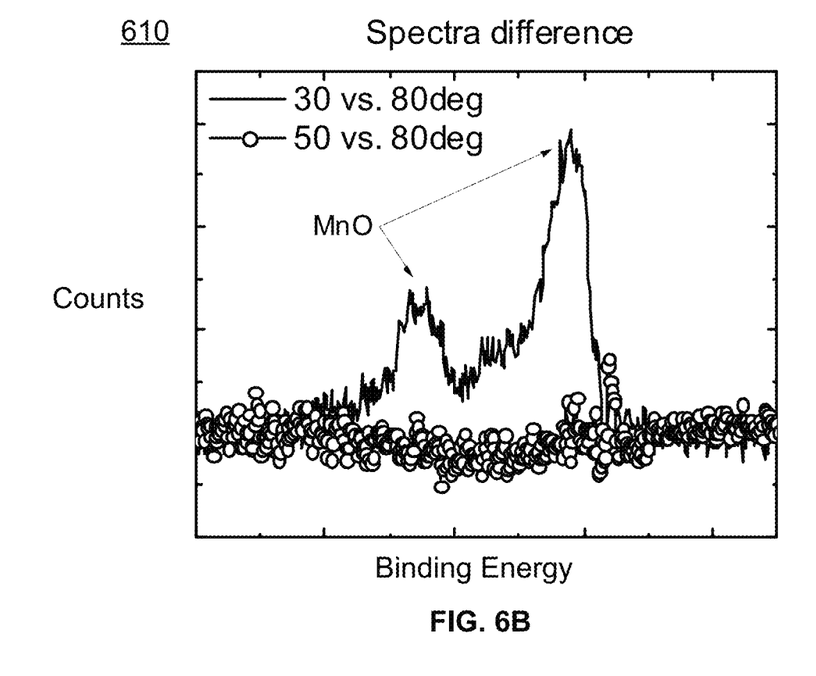

Further, the differences in Mn oxidation between the fifty degree deposition and eighty degree deposition is small. This can be further seen with respect to FIG. 6B, which depicts graph 610 of thirty degree versus eighty degree deposition of tunneling barrier layer 520 and fifty degree versus eighty degree deposition of tunneling barrier layer 520. Although small for the thirty degree deposition (as compared to below thirty degrees), the MnO peaks for the fifty and eighty degree deposition is even further reduced. Thus, oxidized Mn may be less likely to be present in free layer 510 near the interface with tunneling barrier layer 520 for higher deposition angles of at least fifty degrees. It is believed that the oxidized Mn is undesirable for TMR. Thus, a deposition angle of at least thirty degrees may greatly reduce the presence of oxidized Mn. A deposition angle of fifty degrees through ninety degrees may further reduce the presence of oxidized Mn. In addition, the difference in oxidation of Mn near tunneling barrier layer is not significantly different between fifty degrees and eighty degrees (or more) in some embodiments. Thus, as indicated above, TMR for magnetic junction 500 formed using method 400 may be improved while maintaining magnetic moments 512 and 532 that are perpendicular to plane.

Figure 7:
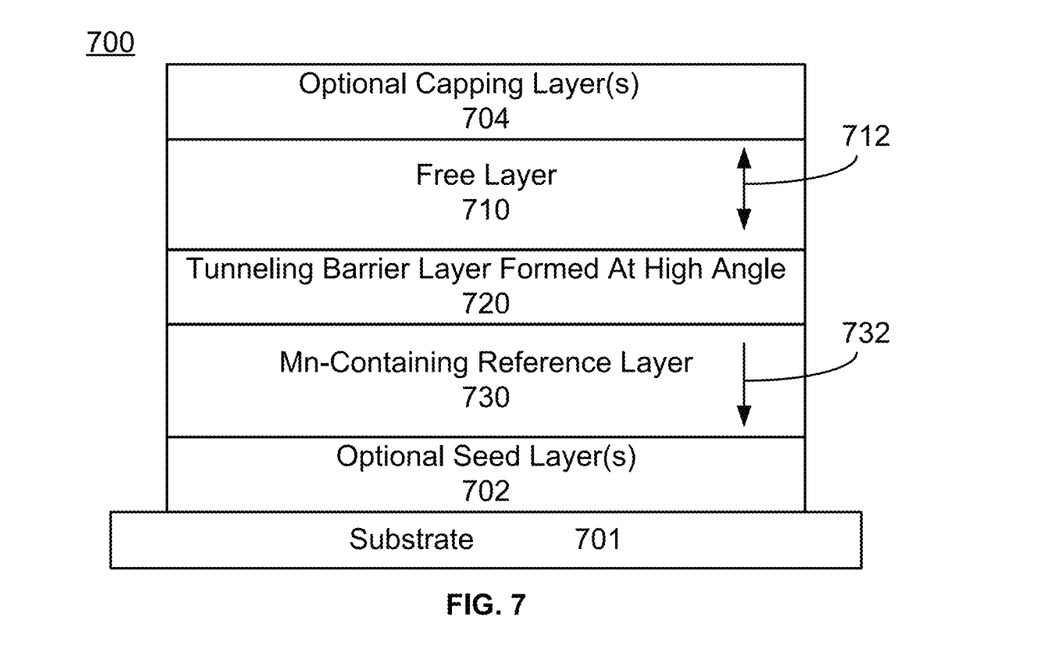
FIG. 7 depicts another embodiment of a magnetic junction including a tunneling barrier layer formed using high deposition angle(s).

FIG. 7 depicts another embodiment of a portion of magnetic device 700 formed using method 400. Magnetic device 700 is a magnetic junction formed on substrate 701. Magnetic junction 700 may include other and/or additional structures. For clarity, FIG. 7 is not to scale. Magnetic device 700 includes free layer 710 having changeable magnetic moment 712, tunneling barrier layer 720 and reference layer 730 having magnetic moment 732. In some embodiment, magnetic junction 700 includes optional seed layer(s) 702, and/or optional capping layer(s) 704. Reference layer 730 is formed at 402. Tunneling barrier layer 720 is fabricated at 404. Free layer 710 is provided at 406. Optional interfacial layer(s) such as polarization enhancement layer(s) may also be present but are not shown for simplicity.

Reference layer 730 is analogous to free layer 510. Reference layer 730 may be or include a Mn-containing layer including one or more of the Heuser compounds described with reference to free layer 510. However, the magnetic moment 732 of reference layer may be stabilized. For example, reference layer 730 may be thicker than free layer 510 and/or a magnetic stabilization structure may be used to increase the coercivity of reference layer 730. Tunneling barrier layer 720 is analogous to tunneling barrier layer 520. Thus, some or all of tunneling barrier layer 720 is formed using a high deposition angle in a manner analogous to method 100. Free layer 710 is analogous to reference layer 530 in that free layer 710 can but need not include Mn-containing Heusler, Mn-containing $L1_0$ and/or Mn-containing C38 compounds and/or Fe, CoFe and/or CoFeB alloys. However, magnetic moment 712 of free layer 710 is not stabilized in some embodiments.

Magnetic junction 700 may share the benefits of magnetic junction 500. TMR for magnetic junction 700 formed using method 400 may be improved while maintaining magnetic moments 712 and 732 that are perpendicular-to-plane and thermally stable for smaller thicknesses and lengths. For example, TMR for magnetic junction 700 may be at least forty percent. In some embodiments, TMR for magnetic junction 700 is at least fifty percent. In some cases, TMR for magnetic junction 700 may be higher. In some embodiments, TMR may be not more than eight hundred fifty percent at room temperature. In some embodiments, TMR is not more than three hundred percent at room temperature. In some embodiments, TMR does not exceed two hundred and fifty percent at room temperature. In some embodiments, TMR is not more than two hundred percent at room temperature. Higher TMR (e.g. fifty percent through two hundred percent or above at room temperature) may be achieved in some embodiments by improving the coherency between the tunneling barrier and magnetic layers and/or by reducing thermal fluctuations that disturb the spin polarization of the magnetic layer as discussed above.

Figure 8:
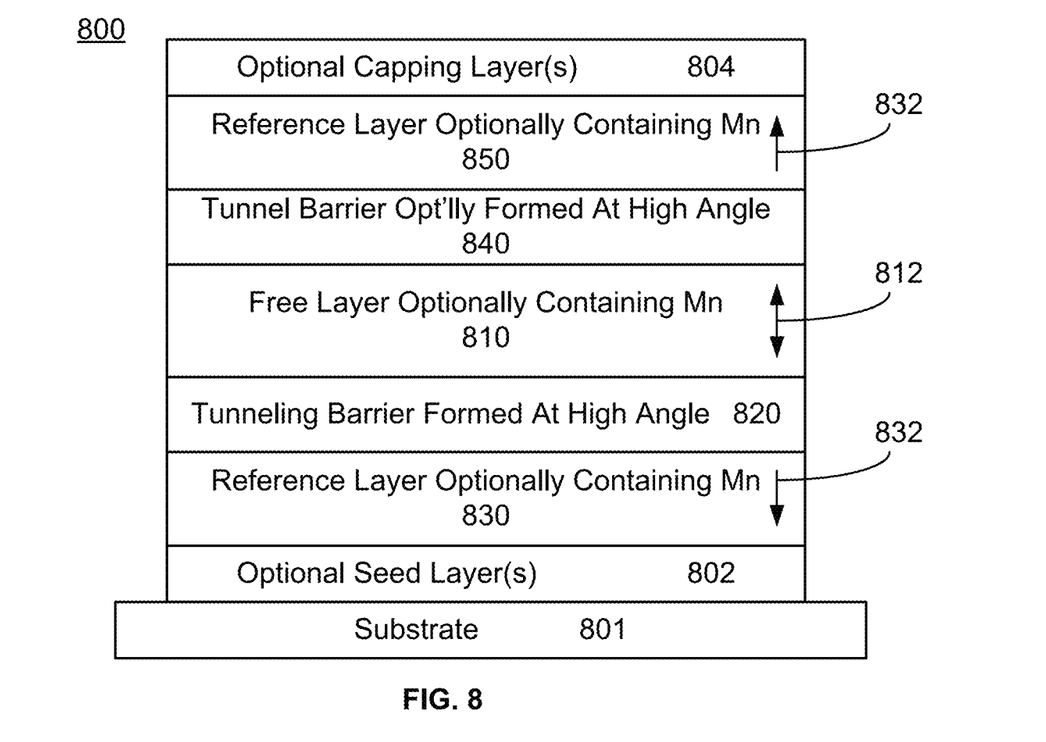
FIG. 8 depicts embodiments of a magnetic junction including tunneling barrier layer(s) formed using high deposition angle(s).

FIG. 8 depicts another embodiment of a portion of magnetic device 800 formed using method 400. Magnetic device 800 is a magnetic junction formed on substrate 801. Magnetic junction 800 may include other and/or additional structures. For clarity, FIG. 8 is not to scale. Magnetic device 800 includes free layer 810 having changeable magnetic moment 812, tunneling barrier layer 820 and reference layer 830 having magnetic moment 832. In some embodiment, magnetic junction 800 includes optional seed layer(s) 802, and/or optional capping layer(s) 804. Reference layer 830 is formed at 402. Tunneling barrier layer 820 is fabricated at 404. Free layer 810 is provided at 406. Optional interfacial layer(s) such as polarization enhancement layer(s) may also be present but are not shown for simplicity.

Reference layer 830 is analogous to free layer 510 and reference layer 730. Reference layer 830 may be or include a Mn-containing layer including one or more of the Heuser compounds described with reference to free layer 510. Magnetic moment 832 of reference layer 830 may also be stabilized. Tunneling barrier layer 820 is analogous to tunneling barrier layer(s) 520 and 720. Thus, some or all of tunneling barrier layer 820 is formed using a high deposition angle in a manner analogous to method 100. Free layer 810 is analogous to reference layer 530 and free layer 710 in that free layer 810 can but need not include Mn-containing Heusler. $L1_0$ and/or C38 compounds and/or Fe, CoFe and/or CoFeB alloys. Magnetic moment 812 of free layer 810 may not be stabilized.

Also shown are tunneling barrier layer 840 and additional reference layer 850. Reference layer 850 may be analogous to reference layer 530 and/or free layer 710. Thus, in some embodiments, reference layer 840 may be or include a Mn-containing layer including one or more of the Heuser, $L1_0$ and/or C38 compounds described with reference to free layer 510. Reference layer 850 may also include Fe, CoFe and/or CoFeB alloys. Thus, in some embodiments, tunneling barrier layer 840 is analogous to tunneling barrier layer 820, 720 and 520. Thus, some or all of tunneling barrier layer 840 may be formed utilizing a high angle deposition angle in a process analogous to method 100 and/or 404.

Magnetic junction 800 may share the benefits of magnetic junction(s) 500 and/or 700. TMR for magnetic junction 800 formed using method 400 may be improved while maintaining magnetic moments 812 and 832 that are perpendicular to plane and thermal stability of magnetic junction 800 for small thicknesses and sizes of magnetic layers 810, 830 and 850. For example, TMR for magnetic junction 800 may be at least forty percent. In some embodiments, TMR for magnetic junction 800 is at least fifty percent. In some cases, TMR for magnetic junction 800 may be higher. In some embodiments, TMR may be not more than eight hundred fifty percent at room temperature. In some embodiments, TMR is not more than three hundred percent at room temperature. In some embodiments, TMR does not exceed two hundred and fifty percent at room temperature. In some embodiments, TMR is not more than two hundred percent at room temperature. Higher TMR may be achieved in some embodiments by improving the coherency between the tunneling barrier and magnetic layers and/or by reducing thermal fluctuations that disturb the spin polarization of the magnetic layer as discussed above.

Figure 9:
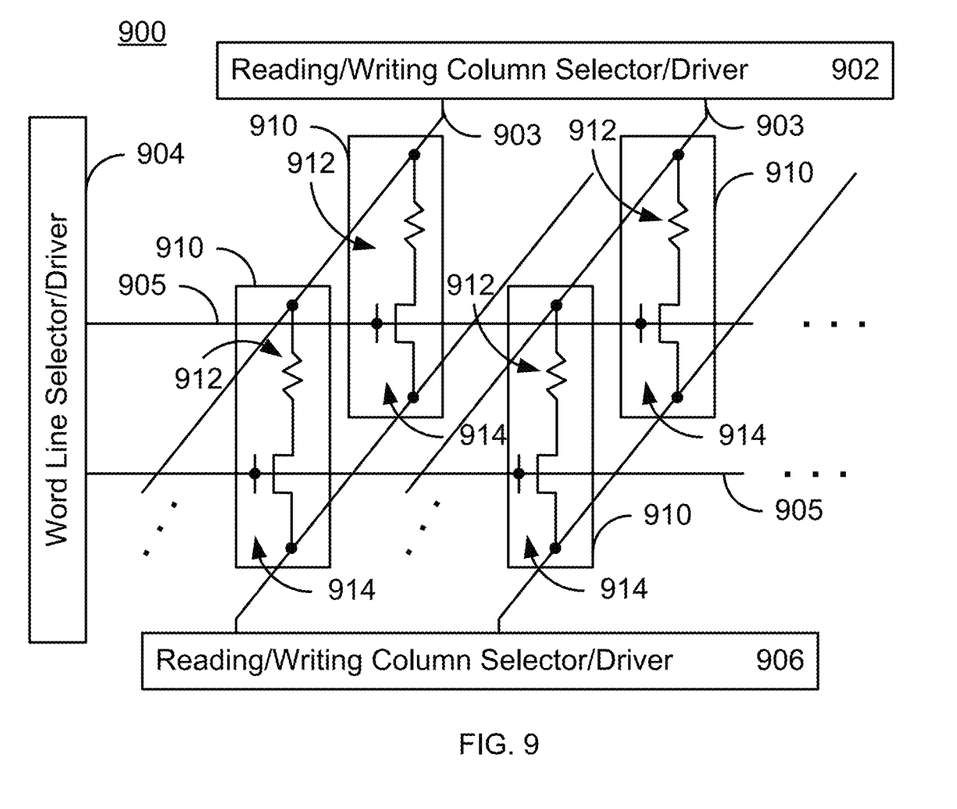
FIG. 9 depicts an embodiment of a memory utilizing magnetic junctions having tunneling barrier layer(s) formed using high deposition angle(s) for the memory element(s) of the storage cell(s).

FIG. 9 depicts an embodiment of memory 900 that may use magnetic junctions described herein. Memory 900 may use one or more of the magnetic junctions 100, 500, 700, 800 and/or other magnetic junctions having tunneling barrier layers such as tunneling barrier layer 220 formed using a high deposition angle. In other embodiments, the memory may a different configuration and/or that utilize different mechanisms for reading and/or writing to the magnetic junctions. The magnetic memory 900 includes reading/writing column select drivers 902 and 906 as well as word line select driver 904. Note that other and/or different components may be provided. The storage region of the memory 900 includes magnetic storage cells 910. Each magnetic storage cell includes at least one magnetic junction 912 utilized as a memory element (e.g. to store data) and at least one selection device 914. Selection devices 914 are enabled by lines 905, while lines 903 are used for magnetic junctions 912. In some embodiments, the selection device 914 is a transistor. The magnetic junctions 912 may be one of the magnetic junctions 500, 700, 800 and/or other magnetic junctions including a tunneling barrier layer formed using high deposition angle(s). Although one magnetic junction 912 is shown per cell 910, in other embodiments, another number of magnetic junctions 912 may be provided per cell. As such, the magnetic memory 900 may enjoy the benefits described above.

Although the foregoing embodiments have been described in some detail for purposes of clarity of understanding, the present disclosure is not limited to the details provided. There are many alternative ways of implementing the present disclosure. The disclosed embodiments are illustrative and not restrictive.

What is claimed is:
1. A magnetic junction comprising:
   a reference layer;
   a tunneling barrier layer;
   a free layer, the tunneling barrier layer being between the reference layer and the free layer, at least one of the reference layer and the free layer including a material having at least one of a Heusler compound that contains Mn, an L10 compound that contains Mn, and a C38 compound that contains Mn, the tunneling barrier layer being formed on the material; and
   an epitaxial interface between the tunneling barrier layer and the at least one of the reference layer and the free layer,
   wherein the magnetic junction has a tunneling magnetoresistance (TMR) of at least forty percent, and wherein the material is substantially free of oxidized Mn at an interface with the tunneling barrier layer.

2. The magnetic junction of claim 1, wherein the TMR is at least fifty percent and not more than three hundred percent at room temperature.

3. The magnetic junction of claim 1, wherein the Heusler compound is a tetragonal Heusler compound.

4. The magnetic junction of claim 1, wherein the at least one of the Heusler compound, the L10 compound, and the C38 compound has (i) a perpendicular magnetic anisotropy energy and (ii) an out-of-plane demagnetization energy less than the perpendicular magnetic anisotropy energy.

5. The magnetic junction of claim 1, wherein at least a portion of the tunneling barrier layer is deposited at a deposition angle of at least thirty degrees from a normal to a surface of the material, the portion of the tunneling barrier layer being adjacent to the surface of the material.

6. The magnetic junction of claim 5 wherein the at least the portion of the tunneling barrier layer has a thickness of at least one unit cell.

7. The magnetic junction of claim 5, wherein the tunneling barrier layer includes an additional portion deposited at an additional deposition angle of less than thirty degrees from the normal.

8. The magnetic junction of claim 5, wherein the tunneling barrier layer includes an additional portion deposited at another deposition angle of at least thirty degrees from the normal.

9. A magnetic device, comprising:
   a plurality of magnetic junctions, each of the plurality of magnetic junctions including a reference layer, a tunneling barrier layer and a free layer, at least one of the reference layer and the free layer including a material including at least one of a Heusler compound that contains Mn, an L10 compound that contains Mn and a C38 compound that contains Mn, the tunneling barrier layer being formed on the material, and an epitaxial interface between the tunneling barrier layer and the at least one of the reference layer and the free layer, wherein at least one of the plurality of magnetic junctions has a tunneling magnetoresistance (TMR) of at least forty percent, and wherein the material is substantially free of oxidized Mn at an interface with the tunneling barrier layer; and
   a plurality of conductive lines coupled with the plurality of magnetic junctions.

10. The magnetic device of claim 9, wherein at least a portion of the tunneling barrier layer is deposited at a deposition angle of at least thirty degrees from a normal to a surface of the material, the portion of the tunneling barrier layer being adjacent to the surface of the material.

11. The magnetic device of claim 9, wherein the material has (i) a perpendicular magnetic anisotropy energy and (ii) an out-of-plane demagnetization energy less than the perpendicular magnetic anisotropy energy.

* * * * *